United States Patent
Wang et al.

[11] Patent Number: 5,597,320
[45] Date of Patent: Jan. 28, 1997

[54] ZERO INSERTION FORCE ELECTRICAL CONNECTOR AND TERMINAL

[75] Inventors: Leland Wang, Hacienda Hts., Calif.; Nai K. Wong, Singapore, Singapore

[73] Assignee: Molex Incorporated, Lisle, Ill.

[21] Appl. No.: 367,566

[22] Filed: Jan. 3, 1995

[51] Int. Cl.⁶ .................................................. H01R 4/50
[52] U.S. Cl. ........................................................... 439/342
[58] Field of Search ........................... 439/259, 261–266, 439/330, 331, 342

[56] References Cited

U.S. PATENT DOCUMENTS

| | | | |
|---|---|---|---|
| 3,315,212 | 4/1967 | Peterson | 339/75 |
| 4,375,309 | 3/1983 | Griffin | 339/75 M |
| 4,391,408 | 7/1983 | Hanlon et al. | 339/75 M |
| 4,498,725 | 2/1985 | Bright et al. | 339/176 M |
| 4,509,812 | 4/1985 | Lotter | 339/75 M |
| 4,647,134 | 3/1987 | Nonaka | 439/342 X |
| 4,674,811 | 6/1987 | Corwin | 439/69 |
| 4,750,891 | 6/1988 | Egawa | 439/259 |
| 4,887,974 | 12/1989 | Ichimura et al. | 439/259 |
| 4,988,310 | 1/1991 | Bright | 439/342 |
| 5,092,789 | 3/1992 | Sinclair | 439/342 X |
| 5,342,214 | 8/1994 | Hsu | 439/342 |
| 5,443,591 | 8/1995 | Tsai | 439/342 |
| 5,489,218 | 2/1996 | McHugh | 439/342 |

FOREIGN PATENT DOCUMENTS

| 1000554 | 8/1995 | United Kingdom | 439/342 |
|---|---|---|---|

*Primary Examiner*—Khiem Nguyen
*Attorney, Agent, or Firm*—Charles S. Cohen

[57] ABSTRACT

A zero insertion force (ZIF) electrical connector for a pin grid array (PGA) device includes upper and lower housings movable in a contact mating direction between a free or contact insertion position and a lock or contact mated position. Pin terminals of the PGA device extend through openings in the upper housing and into cavities in the lower housing. Each cavity includes a resilient terminal having a mounting portion, a leaf spring portion parallel to the direction of contact mating, a free end portion and a contact structure between the leaf spring portion and the free end portion. A pin engagement surface on the contact structure confined substantially within the lateral bounds of the leaf spring portion has a flat portion and a ramp portion inclined relative to the contact mating direction and causes the leaf spring portion to flex in a direction perpendicular to the mating direction. The contact structure and the free end portion are offset from the leaf spring portion in the direction opposite to the direction of spring flexing.

21 Claims, 2 Drawing Sheets

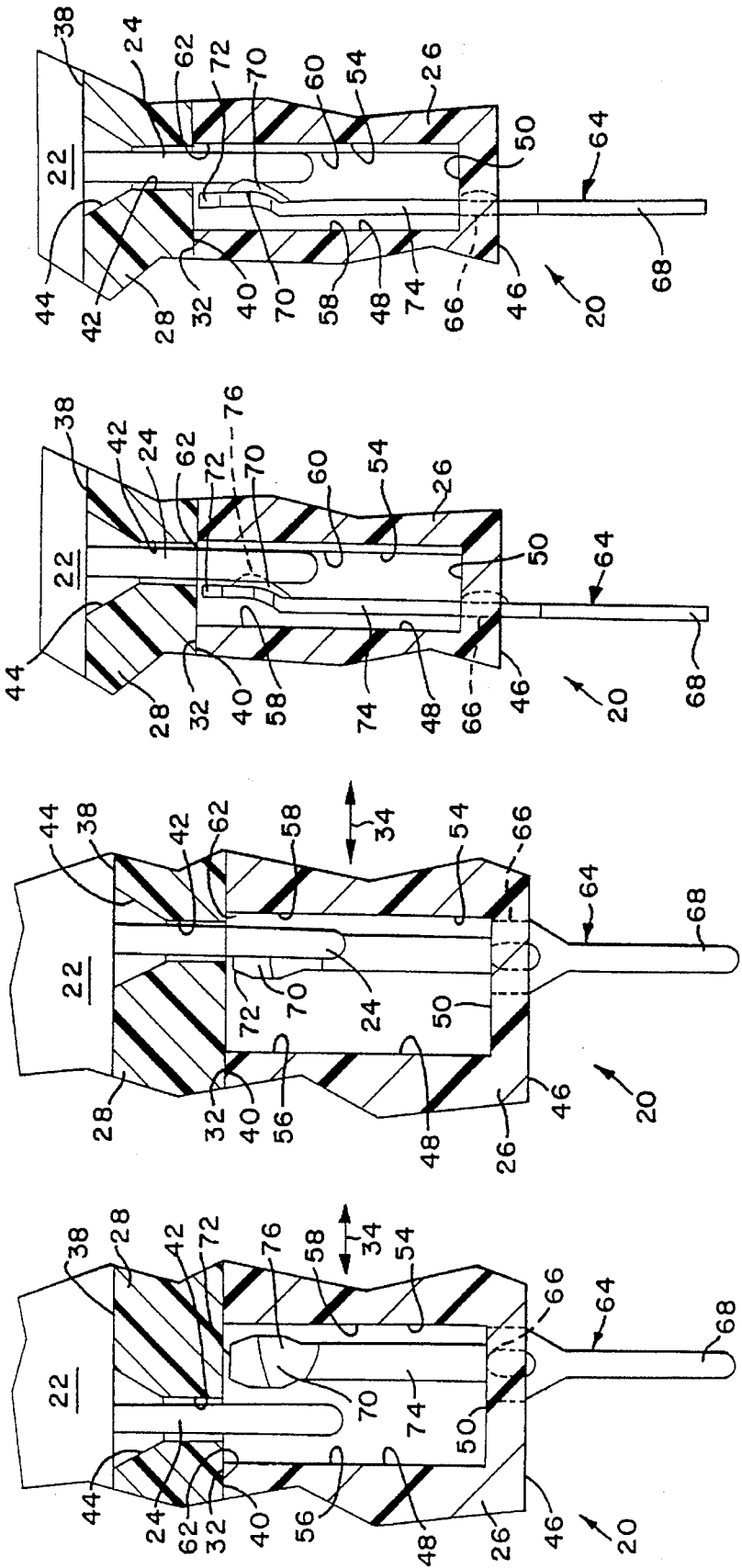

2

ZERO INSERTION FORCE ELECTRICAL CONNECTOR AND TERMINAL

FIELD OF THE INVENTION

The present invention relates to electrical connectors and more particularly to zero insertion force electrical connectors such as those used for pin grid array devices.

DESCRIPTION OF THE PRIOR ART

A pin grid array (PGA) device such as a microprocessor may have many pin terminals, numbering for example in the hundreds. Electrical connectors are used to mount PGA devices on a printed circuit board and establish electrical connections between the pin terminals of the PGA device and conductors of the printed circuit board. A typical electrical connector permits the PGA device to be removed for repair or upgrade purposes. Another beneficial result that the PGA device is not subjected to heat when the connector is soldered to a printed circuit board.

In some known electrical contact systems, when a pin terminal is inserted into a cavity of the connector, it contacts and resiliently deforms a mating contact. As a result forces are required to mate and unmate such a contact system. Mating forces are not desirable in electrical connectors for devices such as PGA devices because the large number of contacts results in large cumulative forces. When there is a need to eliminate mating forces, a connector known as a zero insertion force (ZIF) connector can be used.

A typical zero insertion force connector includes a lower housing with numerous cavities corresponding to the array of pin terminals of a PGA device. A resilient electrical terminal is mounted in each cavity. An upper housing includes numerous openings through which the terminals of the PGA device extend. The upper housing can be moved relative to the lower housing between free and locked positions. In the free position. The PGA device can be placed with no contact insertion force upon the upper housing with the pin terminals extending through the upper housing and into regions in the cavities of the lower housing where they are spaced from the resilient terminals. The upper housing is then moved laterally relative to the lower housing, causing the pin terminals to move into contact with the resilient terminals in the cavities. The area of contact on the resilient terminal is typically plated with a noble metal to prevent contact degradation due to oxidation.

U.S. Pat. No. 4,498,725 to Bright et al. and U.S. Pat. No. 4,750,891 to Egawa at FIGS. 5 and 7 disclose zero insertion force connectors with resilient terminals having contact structures in the form of a pair of spaced apart resilient opposed fingers between which a pin terminal may be received.

U.S. Pat. No. 4,674,811 to Corwin, U.S. Pat. No. 4,750,891 to Egawa at FIGS. 8A and 8B and U.S. Pat. No. 4,887,974 to Ichimura et al. disclose zero insertion force connectors with terminals having free ends with contact structures and spring portions that flex in the same direction as the pin terminals move in order to provide a contact force.

U.S. Pat. No. 4,988,310 to Bright et al. discloses a zero insertion force connector having terminals with an upstanding beam, a cantilever beam portion extending laterally from the upstanding beam and a contact area upon the cantilever beam acting to cause torsional deflection of the cantilever beam.

U.S. Pat. No. 5,342,214 to Hsu discloses a zero insertion force connector having two upstanding terminal portions, one including a laterally extending guide portion 430 and a noninclined contact portion 43.

Although these various types of zero insertion force connectors have been disclosed, they have not solved long standing problems to which zero insertion force connectors and terminals have been subject. One disadvantage of known terminals and connectors is that the spacing or pitch between adjacent terminals in the connector cannot be reduced to a small distance required for modern PGA devices having small pitch distances. Many known designs have a terminal pitch of 5.08 millimeters, requiring an undesireably large amount of material and plating. This large pitch is also not well adapted to a staggered terminal array. A terminal pitch of 2.54 millimeters is presently common, and a staggered pitch of half that distance also exists. Another problem is that many known terminals for zero insertion force connectors have complex shapes that are subject to snagging or breaking and are expensive to manufacture and assemble. Another difficulty is that with many known terminal configurations, relatively extensive areas of each contact structure must be plated, making the plating process difficult and expensive.

SUMMARY OF THE INVENTION

Principal objects of the present invention are to provide a zero insertion force connector and terminal that can achieve very close contact spacings; to provide a terminal for zero insertion force connectors that is simple, sturdy and easy and inexpensive to manufacture and to assemble into a connector housing; and to provide a zero insertion force connector and terminal in which the expense of plating of the contact areas is minimized.

In brief, in accordance with the invention, there is provided a zero insertion force electrical connector for use with a PGA device having an array of pin terminals. The electrical connector comprises a first connector housing having an array of cavities corresponding to the array of pin terminals and a second connector housing having an array of openings through which the pin terminals extend into the cavities. Each of the cavities includes a base wall spaced from the second connector housing and a side wall. A terminal is mounted in each of the cavities and includes a mounting portion for securing the terminal in the base wall, a free end portion, a contact structure located adjacent the free end portion and a leaf spring portion extending from the base wall to the contact structure. The connector housings are mounted for relative movement in a first direction along a path of travel between a free position wherein the pins are spaced from the contact structures in the cavities and a lock position wherein the pins engage the contact structures. The leaf spring portion of each contact is flexible in a second direction generally perpendicular to the first direction to provide a contact force when mated with one of the pin terminals. The leaf spring portion of each terminal is generally parallel to the path of travel. The contact structure includes a pin engagement surface at least partly inclined with respect to the path of travel and disposed within the lateral bounds of the leaf spring portion.

In brief, in accordance with another feature of the invention, there is provided a terminal for use in a terminal receiving cavity of a lower housing of a ZIF connector for a PGA device. The terminal comprises a stamped and formed sheet metal body having a mounting portion for securing the terminal in the connector cavity. A flat planar leaf spring portion extends from the mounting portion. A contact structure is formed at the end of the leaf spring portion remote from the mounting portion. The leaf spring portion is flexible in a first direction normal to its plane to provide a contact force. The contact structure includes a pin engagement surface projecting opposite to the first direction and at least partly inclined relative to the plane of the leaf spring portion. At least a major segment of the pin engagement surface is disposed within the lateral bounds of the leaf spring portion.

BRIEF DESCRIPTION OF THE DRAWING

The present invention together with the above and other objects and advantages may best be understood from the following detailed description of the preferred embodiment of the invention illustrated in the drawings, wherein:

FIG. 6 is a sectional view of the electrical connector taken along the line 6—6 of FIG. 4;

FIG. 7 is a view like FIG. 6 illustrating the terminals in the locked or interconnected positions;

FIG. 8 is a sectional view of the electrical connector taken along the line 8—8 of FIG. 4;

FIG. 9 is a view like FIG. 8 illustrating the terminals in the locked or interconnected positions;

FIG. 10 is a fragmentary, greatly enlarged front elevational view of the contact structure of an electrical terminal of the connector of FIG. 1; and.

DETAILED DESCRIPTION OF THE PREFERRED EMBODIMENTS

Figure 1:
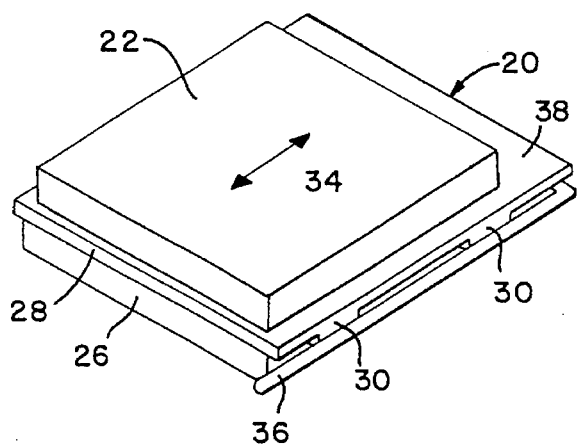
FIG. 1 is an isometric view of a PGA device mounted on an electrical connector constructed in accordance with the present invention.
Figures 2, 3:
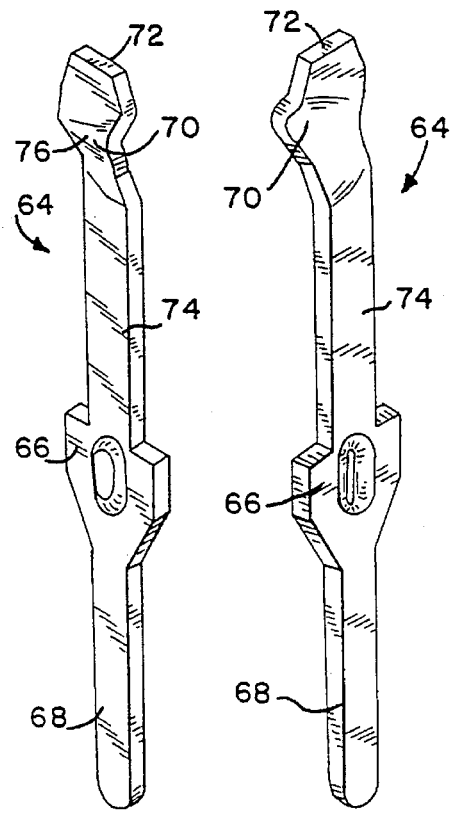
FIG. 2 is a perspective front view on an enlarged scale of an electrical terminal of the connector of FIG. 1.
FIG. 3 is a perspective rear view on an enlarged scale of an electrical terminal of the connector of FIG. 1.
Figure 4:
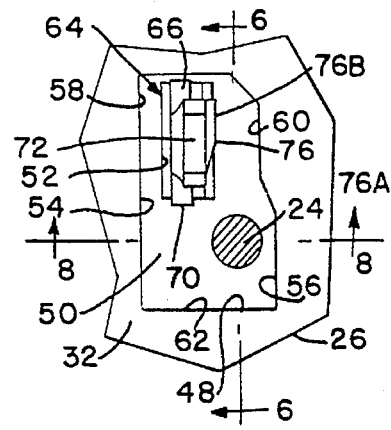
FIG. 4 is a fragmentary top plan view on an enlarged scale of part of the top surface of the lower housing of the connector of FIG. 1 with a pin terminal of the PGA device shown in section, illustrating the terminals in the free or zero insertion force positions.
Figure 5:
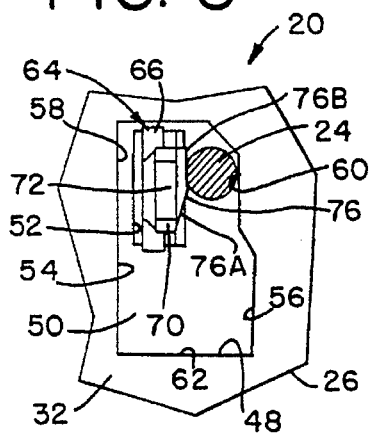
FIG. 5 is a view like FIG. 4 illustrating the terminals in the locked or interconnected positions.

Having reference now to the drawings, FIG. 1 illustrates a zero insertion force connector designated as a whole as 20 used with a PGA device 22. In a preferred arrangement the PGA device may be a microprocessor having hundreds of pin terminals 24 (FIGS. 4–9 and 11) typically in a staggered array. Connector 20 is mounted by soldering to a printed circuit board (not shown) and releasably receives the device 22 in order to make electrical connections between the pin terminals 24 and conductive areas of the printed circuit board.

In general the zero insertion force connector 20 includes a lower housing 26 and an upper housing 28. Latch and guide structures 30 are provided on the housings 26 and 28 in order to removably secure the upper housing 28 on the upper surface 32 (FIGS. 4–9) of the lower housing 26. The housings 26 and 28 are relatively movable in the plane of the surface 32 in the direction indicated by an arrow 34 (FIGS. 1 and 4–7). An operating lever 36 is rotatably supported by the lower housing 26 and engages the upper housing 28 to move it between a free position seen in FIGS. 1, 4, 6 and 8 and a lock position seen in FIGS. 5, 7 and 9. In these respects the housings 26 and 28 and the lever 36 may be conventional, and reference may be had to U.S. Pat. No. 4,498,725, incorporated herein by reference, for a disclosure of one conventional arrangement.

Upper housing 28 includes an upper surface 38 upon which the device 22 is mounted and a lower surface 40 that slides across the surface 32 in response to manipulation of the operating lever 36. Numerous openings 42 extend through the upper housing 28 between the upper and lower surfaces 38 and 40. All the openings 42 may be identical, and one of these openings 42 is shown in FIGS. 6–9. An opening 42 is provided for each pin terminal 24 of the device 22 and openings 42 are arrayed in the same pattern as the array of pin terminals 24 so that the device 22 can be placed upon the surface 38 with terminals 42 extending through the openings 42 of the upper housing 28. Each opening 42 has a 44 sloped entry mouth to facilitate entry of the pin terminals 42.

The lower housing 26 has a lower surface 46 generally parallel to the upper surface 32. Numerous cavities 48 extend from the upper surface 32 toward the lower surface 46. All of the cavities 48 may be identical, and one of these cavities is seen in FIGS. 4–9. A cavity 48 is provided for each pin terminal 24 of the device 22, and the cavities are arrayed in the same pattern as the pin terminals 24 and the openings 42.

The cavity 48 seen in FIGS. 4–9 has a bottom wall 50. A terminal mounting opening 52 extends from the bottom wall 52 to the lower surface 46. A side wall 54 defines a relatively wider pin terminal receiving region 56 and a relatively narrower terminal contact region 58. The narrower region 58 is defined in part by a terminal backing wall 60. An upper mouth 62 of the cavity 48 registers with the corresponding opening 42 of the upper housing 28.

Each cavity 48 includes a resilient terminal generally designated as 64 having a mounting portion 66 and a depending pin contact portion 68. A terminal 64 is mounted in each cavity 48 by inserting the terminal through the mouth 62 and pressing the mounting portion 66 into firm mounting engagement within the opening 52. The pin contact portion 68 extends below the lower housing 26 for interconnection with a printed circuit board. Another contact type such as a surface mount contact could be used in place of the pin contact portion 68 if desired. An advantage of the connector and terminal of the invention is that the terminals are small enough to permit terminals formed in a stamping and forming operation from a single sheet of metal to be inserted into every cavity 48 in a row of cavities before the terminals are severed from a single carrier strip.

Within the cavity 48, the terminal 64 includes a contact structure 70 located between a free end portion 72 and a leaf spring portion 74 extending from the mounting portion 66. In the free position of the housings 26 and 28 seen in FIGS. 4, 6 and 8, each pin terminal 24 of the device 22 is received with no mating or insertion force into the wider region 56 of the corresponding cavity 48. When the lever 36 is used to move the housings to the lock position, each pin terminal 24 moves in the direction of the arrow 34 relative to the lower housing 26 into the narrower region 58 of the cavity 48. Engagement of the pin terminal 24 with the backing wall 60 assures that the pin terminal 24 engages the contact structure 70 and moves it in the direction perpendicular to the arrow 34. This movement is permitted by resilient deflection of the leaf spring portion 74. The flat planar spring portion 72 is parallel to the mating direction indicated by the arrow 34, and the spring portion flexes in the direction perpendicular to the arrow 34.

The contact structure 70 is formed by offsetting material from the plane of the leaf spring portion 74 in the direction opposite to the direction that the contact structure is moved by engagement with the pin terminal 24. In addition the free end 72 is offset in the same direction from the plane of the leaf spring portion in order to avoid interference between the pin terminal 24 and the leaf spring portion 74. The contact structure 70 includes a pin engagement surface 76 having a ramp or lead in portion 76A that is inclined relative to the contact mating direction indicated by the arrow 34. The ramp surface 76A acts as a cam to cause resilient deflection of the leaf spring portion 74 as the pin terminal moves to the lock position. The inclined ramp surface 76A blends smoothly into an adjacent noninclined surface portion 76B. In the fully mated position, pin terminals 24 engage the noninclined surface portions 76B. It should be noted that in the alternative, noninclined surface portion 76B could be an extension of inclined ramp surface 76A that is generally planar with ramp surface 76A. A further alternative is to modify noninclined surface portion 76B to have an incline opposite that of inclined ramp surface 76A. This would provide some tactile feedback that the pin is in a fully mated position.

The pin engagement surface 76 is located primarily between the lateral bounds of the leaf spring portion. The term "lateral" bounds in this context is defined as a region between the planes including the sides of the leaf spring portion and perpendicular to the arrow 34. As a result, in the lock or fully mated position, the pin terminal 24 contacts the surface 76 at a point between these planes, and the contact force does not cause any significant torsion or twisting of the leaf spring portion 74. This contact structure 70 has the advantages of simplicity and small size.

Figure 10:
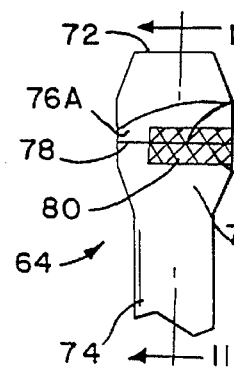
Figure 11:
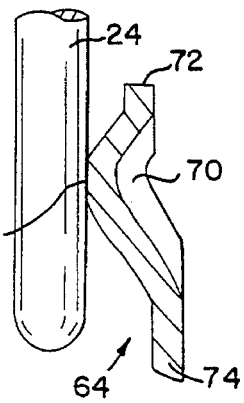
FIG. 11 is a sectional view of the contact structure taken along the line 11—11 of FIG. 10, also showing contact with a pin terminal.

As best seen in FIG. 11, the pin engagement surface 76 is peaked throughout its length. As a result of this peaked configuration and the fact that the pin terminal 24 moves essentially tangentially to the peaked ramp surface, engagement of the pin terminal 24 with the contact structure occurs essentially along a narrow band or line 78 seen in FIG. 10. In addition, because the contact structure does not include elements such as cantilever beams used for lead in or to apply torsional forces, the portion of the line or band 78 where contact occurs is short. An advantage of this arrangement is that the costs of plating the contact area to avoid oxidation are reduced. In the preferred embodiment only the small hatched area 80 seen in FIG. 10 need be plated. Because this area is entirely located upon that part of the Contact area 70 that projects from the leaf spring portion 74 and beyond the free end 72, plating can economically be carried out with a simple and inexpensive partial immersion process.

While the present invention has been described with reference to the details of the embodiment of the invention shown in the drawing, these details are not intended to limit the scope of the invention as claimed in the appended claims.

We claim:

1. A zero insertion force electrical connector for use with a device having an array of pin terminals, said electrical connector comprising:

a first connector housing component having an array of cavities corresponding to the array of pin terminals;

a second connector housing component having an array of openings through which the pin terminals are adapted to extend into said cavities;

each of said cavities including a base wall spaced from the second connector housing and a side wall;

a terminal in each of said cavities, said terminal including a mounting portion for securing said terminal in said base wall, a free end portion, a contact structure adjacent said free end portion and a generally planar leaf spring portion extending from said base wall to said contact structure, each said terminal having only one leaf spring portion and only one contact structure; and means mounting said connector housing components for relative movement in a first direction along a path of travel between a pin terminal insertion position wherein the pin terminals of said device when mounted on said connector are spaced from said contact structures in said cavities and an engagement position wherein the pins engage said contact structures;

said leaf spring portion of each said contact being flexible in a second direction generally perpendicular to said first direction to provide a contact force when mated with one of the pin terminals, the plane of said leaf spring portion of each said terminal being generally parallel to said path of travel;

said leaf spring portion and said contact structure having side edges generally perpendicular to said second direction and said terminal having a generally uniform width between said side edges along said leaf spring portion and said contact structure between said leaf spring portion and said free end portion, said side edges of said leaf spring portion defining lateral bounds thereof; and said contact structure including a pin engagement surface at least partly inclined with respect to said path of travel and disposed within the lateral bounds of said leaf spring portion.

2. A zero insertion force electrical connector as claimed in claim 1, said pin engagement surface including a lead in portion inclined with respect to said path of travel and a noninclined portion adjacent to said lead in portion.

3. A zero insertion force electrical connector as claimed in claim 1, said side wall including a pin terminal backing portion generally parallel to the plane of said leaf spring portion, and said pin engagement surface being spaced from said backing portion by a distance less than the thickness of the pin terminal in the pin terminal insertion position of said housing components.

4. A zero insertion force electrical connector as claimed in claim 1, said contact portion being spaced inwardly from said free end portion.

5. A zero insertion force electrical connector as claimed in claim 4, said contact structure comprising a peaked portion of said terminal defining said pin engagement surface.

6. A zero insertion force electrical connector as claimed in claim 5, further comprising a plating upon said contact area, said plating being limited to the region immediately surrounding said pin engagement surface.

7. A zero insertion force electrical connector as claimed in claim 5, said contact structure being offset from the plane of said leaf spring portion in a direction opposite to said second direction.

8. A zero insertion force electrical connector as claimed in claim 5, said contact structure and said free end portion being offset from the plane of said leaf spring portion in a direction opposite to said second direction.

9. A terminal for use in a terminal receiving cavity of a lower housing of a ZIF connector for a PGA device, said terminal comprising:
   a stamped and formed sheet metal body having a mounting portion for securing the terminal in the connector cavity;
   a flat planar leaf spring portion extending from said mounting portion;
   a contact structure formed at the end of said leaf spring portion remote from said mounting portion;
   said leaf spring portion being flexible in a first direction normal to its plane to provide a contact force through said contact structure, said leaf spring portion having generally parallel side edges along the length thereof between said mounting portion and said contact structure to define lateral bounds of said leaf spring portion, said side edges being oriented generally parallel to said first direction;
   said contact structure including a pin engagement surface projecting opposite to said first direction and being at least partly inclined relative to the plane of said leaf spring portion, at least a major segment of said pin engagement surface being disposed within the lateral bounds of said leaf spring portion; and
   said terminal having only one leaf spring portion and only one contact structure.

10. A terminal as claimed in claim 9 wherein said pin engagement surface includes an inclined ramp portion and a noninclined portion adjacent to said ramp portion.

11. A terminal as claimed in claim 9 further comprising a second contact structure extending from said mounting structure opposite said leaf spring portion.

12. A terminal as claimed in claim 11, said second contact structure comprising a pin contact for soldering said terminal to a circuit member.

13. A terminal as claimed in claim 9, further comprising a free end portion of said terminal, said contact structure being located between said leaf spring portion and said free end portion, said contact structure being located inward of said free end portion.

14. A terminal as claimed in claim 13, said free end portion and said contact structure being offset from the plane of said leaf spring portion.

15. A terminal as claimed in claim 13, said free end portion and said contact structure being offset from the plane of said leaf spring portion and said pin engagement surface projecting beyond the extent of said free end portion.

16. A terminal as claimed in claim 9, said terminal including a plated area, said plated area being confined to the immediate area of said pin engagement surface.

17. A zero insertion force electrical connector as claimed in claim 1, said side edges being generally parallel.

18. A terminal as claimed in claim 9 wherein said terminal has a generally uniform width between said side edges along said leaf spring portion.

19. A zero insertion force electrical connector for use with a device having an array of pin terminals, said electrical connector comprising:
   a first connector housing component having an array of cavities corresponding to the array of pin terminals;
   a second connector housing component having an array of openings through which the pin terminals are adapted to extend into said cavities;
   each of said cavities including a base wall spaced from the second connector housing and a side wall;
   a terminal in each of said cavities, said terminal including a mounting portion for securing said terminal in said base wall, a free end portion, a contact structure adjacent said free end portion and a generally planar leaf spring portion extending from one end of said mounting portion to said contact structure, a pin contact extending from a second end of said mounting portion opposite said first end for soldering said terminal to a circuit member, each said terminal having only one leaf spring portion, only one contact structure and only one pin contact; and
   means mounting said connector housing components for relative movement in a first direction along a path of travel between a pin terminal insertion position wherein the pin terminals of said device when mounted on said connector are spaced from said contact structures in said cavities and an engagement position wherein the pins engage said contact structures;
   said side wall including a pin terminal backing portion generally parallel to the plane of said leaf spring portion, and said pin engagement surface being spaced from said backing portion by a distance less than the thickness of the pin terminal in the pin terminal insertion position of said housing components;
   said leaf spring portion of each said contact being flexible in a second direction generally perpendicular to said first direction to provide a contact force when mated with one of the pin terminals, the plane of said leaf spring portion of each said terminal being generally parallel to said path of travel;
   said leaf spring portion and said contact structure having side edges generally perpendicular to said second direction and said terminal having a generally uniform width between said side edges along said leaf spring portion and said contact structure between said leaf spring portion and said free end portion, said side edges of said leaf spring portion defining lateral bounds thereof; and
   said contact structure including a pin engagement surface at least partly inclined with respect to said path of travel and disposed within the lateral bounds of said leaf spring portion, said pin engagement surface including a lead in portion inclined with respect to said path of travel and a noninclined portion adjacent to said lead in portion.

20. A zero insertion force electrical connector as claimed in claim 19, further comprising a plating upon said contact area, said plating being limited to the region immediately surrounding said pin engagement surface.

21. A zero insertion force electrical connector as claimed in claim 19, said contact structure being offset from the plane of said leaf spring portion in a direction opposite to said second direction.

* * * * *